(12) United States Patent
Chen et al.

(10) Patent No.: US 7,990,990 B2
(45) Date of Patent: Aug. 2, 2011

(54) CIRCUIT AND METHOD FOR TRANSMITTING DATA STREAM

(75) Inventors: Chung-Kuang Chen, Pan Chiao (TW);
Chun-Hsiung Hung, Hsinchu (TW);
Yi-Te Shih, Zhubei (TW)

(73) Assignee: Macronix International Co., Ltd.,
Hsinchu (TW)

( * ) Notice: Subject to any disclaimer, the term of this patent is extended or adjusted under 35 U.S.C. 154(b) by 845 days.

(21) Appl. No.: 11/953,940

(22) Filed: Dec. 11, 2007

(65) Prior Publication Data

US 2009/0147799 A1 Jun. 11, 2009

(51) Int. Cl.
*H04L 12/28* (2006.01)
(52) U.S. Cl. .......................... 370/412; 375/260; 711/168
(58) Field of Classification Search .......... 370/412–414, 370/428–429, 437, 462, 474, 476; 711/167–169; 375/260
See application file for complete search history.

(56) References Cited

U.S. PATENT DOCUMENTS

| | | | | |
|---|---|---|---|---|
| 3,438,007 A | * | 4/1969 | Warwick | .......................... 365/85 |
| 5,875,191 A | * | 2/1999 | Deschaine et al. | ............. 370/466 |
| 6,320,909 B1 | * | 11/2001 | Takabatake et al. | ..... 375/240.25 |
| 6,466,277 B1 | * | 10/2002 | McNeely | ....................... 348/724 |
| 6,614,691 B2 | * | 9/2003 | Roohparvar | ............. 365/185.23 |
| 7,020,043 B1 | * | 3/2006 | Lee | ............................ 365/230.06 |
| 7,769,558 B2 | * | 8/2010 | Kappauf et al. | .............. 702/124 |
| 2001/0046235 A1 | * | 11/2001 | Trevitt et al. | .................. 370/412 |
| 2002/0167958 A1 | * | 11/2002 | Martin et al. | ................. 370/429 |
| 2006/0088110 A1 | * | 4/2006 | Romero et al. | ................ 375/257 |
| 2007/0002621 A1 | * | 1/2007 | Park | ......................... 365/185.11 |
| 2007/0214335 A1 | * | 9/2007 | Bellows et al. | ............... 711/167 |
| 2008/0114563 A1 | * | 5/2008 | Kappauf et al. | .............. 702/124 |
| 2009/0097311 A1 | * | 4/2009 | Roohparvar et al. | ..... 365/185.03 |

FOREIGN PATENT DOCUMENTS

CN 101009076 1/2007

* cited by examiner

*Primary Examiner* — Chi H. Pham
*Assistant Examiner* — Kevin Mew
(74) *Attorney, Agent, or Firm* — Volpe and Koenig, P.C.

(57) ABSTRACT

A circuit including a first data selection circuit and a second data selection circuit for transmitting a data stream is provided. The first data selection circuit having first controllable channels turns on a first operating channel being one of the first controllable channels in an odd-numbered period and turns off the first controllable channels in an even-numbered period adjacent to the odd-numbered period for transmitting a first bit datum of the data stream. The second data selection circuit having second controllable channels turns off the second controllable channels in the odd-numbered period and turns on a second operating channel being one of the second controllable channels in the even-numbered period for transmitting a second bit datum of the data stream.

24 Claims, 9 Drawing Sheets

CIRCUIT AND METHOD FOR TRANSMITTING DATA STREAM

FIELD OF THE INVENTION

The present invention relates to a circuit and a method for transmitting a data stream, and more particularly to a circuit and a method applied to a memory device for transmitting a data stream.

BACKGROUND OF THE INVENTION

Memory devices made up of integrated circuits for storing data are generally categorized as either volatile, in which the data is lost once the power is turned off, or nonvolatile, in which the data is retained even after the power is turned off.

A multiplexer is a data selection circuit having many input lines and an output line, and selects one of the input lines for transmitting the data of the selected input line to the output line. A demultiplexer is also a data selection circuit the function of which is opposite to the multiplexer. The demultiplexer, which has an input line and many output lines, distributes the data of the input line to the output lines.

Please refer to FIG. 1, which is a block diagram showing a conventional nonvolatile memory device. As shown, the nonvolatile memory device 10 includes a memory array unit 11, a column decoder 12, and an integrated data line driver 13. The memory array unit 11 includes eight memory sub-arrays 110, 111, ... and 117. The column decoder 12 includes eight data selection circuits DTSEL0, DTSEL1, ... and DTSEL7 correspondingly coupled to the eight memory sub-arrays 110, 111, ... and 117. The integrated data line driver 13 includes eight data line drivers DLDRV0, DLDRV1, ... and DLDRV7 correspondingly coupled to the eight data selection circuits DTSEL0, DTSEL1, ... and DTSEL7, and receives data provided from a data bus 14 or provides another data to the data bus 14.

The transmission procedure for programming data into the memory array unit 11 is as follows. The eight data line drivers DLDRV0, DLDRV1, ... and DLDRV7 correspondingly receives eight data streams DTS0, DTS1, ... and DTS7 provided from the data bus 14, and holds eight bit data received in parallel in a programming duty period. The eight data selection circuits DTSEL0, DTSEL1, ... and DTSEL7 form eight demultiplexers controlled by a selection decoder (not shown) for correspondingly distributing and transmitting the eight bit data to the eight memory sub-arrays 110, 111, ... and 117. The transmission procedure for reading data from the memory array unit 11 to the data bus 14 is the reverse similar operation of the programming. In this case, the eight data selection circuits DTSEL0, DTSEL1, ... and DTSEL7 form eight multiplexers.

Afterward, the circumstance transmitting a data stream by a data selection circuit, such as the data selection circuit DTSEL0, is described. Please refer to FIG. 2, which is a block diagram showing a conventional circuit for transmitting a data stream. As shown, the circuit 20 for transmitting the data stream DTS0 includes a data selection circuit 21 and a data line driver 22. The data selection circuit 21 includes four primary switches QA0, QA1, QA2, and QA3 and sixteen secondary switches QB0, QB1, ... and QB15. The source terminals of the four primary switches QA0, QA1, QA2, and QA3 are coupled as a data line DL, and each bit datum of the data stream DTS0 is transmitted through the data line DL. The sixteen secondary switches QB0, QB1, ... and QB15 are equally classified as four secondary switch sets 261, 262, 263, and 264, and the source terminals in each secondary switch set (such as 261) are commonly coupled to the drain terminal of a corresponding primary switch (such as QA0). Besides, the drain terminals of the sixteen secondary switches QB0, QB1, ... and QB15 are correspondingly coupled to sixteen metal bit lines MBL0, MBL1, ... and MBL15.

The four primary switches QA0, QA1, QA2, and QA3 correspondingly receive four control signals YS0, YS1, YS2, and YS3, and four secondary switches (such as QB0, QB1, QB2, and QB3) in each secondary switch set (such as 261) correspondingly receive four control signals YD0, YD1, YD2, and YD3, wherein each control signal controls the turn-on or the turn-off state of a corresponding switch thereof. There is a controllable channel (such as CE1) between the data line DL and the drain terminal of each secondary switch (such as QB1), so that there are sixteen controllable channels CE0, CE1, ... and CE15. Corresponding to the four primary switches QA0, QA1, QA2, and QA3, the sixteen controllable channels CE0, CE1, ... and CE15 are classified as four controllable channel sets F0, F1, F2, and F3. While a selected secondary switch (such as QB1), of the sixteen secondary switches QB0, QB1, ... and QB15, and a corresponding primary switch (such as QA0), of the four primary switches QA0, QA1, QA2, and QA3, are both turned on, a selected controllable channel (such as CE1), of the sixteen controllable channels CE0, CE1, ... and CE15, are turned on.

The data line driver 22 is coupled to the data selection circuit 21 through the data line DL and is for storing each bit datum transmitted in the selected controllable channel in the duty period transmitting the each bit datum.

Afterward, the timing sequence of the circuit 20 in FIG. 2 is illustrated for an example programming a nonvolatile memory (not shown). Please refer to FIG. 3, which is a schematic diagram showing conventional waveforms coming from FIG. 2 for transmitting the data stream. The waveforms in FIG. 3 are a schematic programming pulse signal VPULSE, the data stream DTS0, four control signals YS0, YS1, YS2, and YS3, four control signals YD0, YD1, YD2, and YD3, and the timing of the data stream DTS0 in the data line DL.

In order to program a bit datum BD1 of the data stream DTS0 into a memory cell corresponding to the controllable channel CE0, the data line DL holds a level state of the bit datum BD1 in a duty period PA1 of the programming pulse signal VPULSE and the controllable channel CE0 is turned on; that is, the primary switch QA0 and the secondary switch QB0 are both turned on; and the other controllable channels except the controllable channel CE0 are turned off. Therefore, the bit datum BD1 is transmitted from the data line DL through the controllable channel CE0. Similarly, in order to program a bit datum BD2 of the data stream DTS0 into another memory cell corresponding to the controllable channel CE4, the data line DL holds a level state of the bit datum BD2 in a duty period PA2 of the programming pulse signal VPULSE and the controllable channel CE4 is turned on; that is, the primary switch QA1 and the secondary switch QB4 are both turned on; and the other controllable channels except the controllable channel CE4 are turned off. Therefore, the bit datum BD2 is transmitted from the data line DL through the controllable channel CE4.

As shown in FIG. 3, the control signal of a switch has a rising time in the turn-on process of the switch, and the control signal of the switch has a falling time in the turn-off process of the switch. When the voltage rising time and the voltage falling time between two neighboring duty periods (such as PA1 and PA2) have an overlap, the next bit datum of the data stream can disturb the previous selected memory cell, or the previous bit datum of the data stream can disturb the next selected memory cell. In order to avoid the disturbance between the two time-neighboring controllable channels (such as CE1 and CE4), a duty-gap period (such as PB1) between two neighboring duty periods (such as PA1 and PA2) is needed to prevent the two neighboring controllable channels (such as CE1 and CE4) from the disturbance.

Please refer to FIG. 4, which is a schematic diagram showing a conventional circuit according to the embodiment for the data line driver in FIG. 2. As shown, a data line driver 30 for programming includes a transistor 31, a level shifter 32, a latch unit 34, and an inverter switch 35. The gate of the transistor 31 receives a bias voltage Vb and forms the configuration of a source follower. The level shifter 32 receives the data stream DTS0 and converts a level voltage of the data stream DTS0, so that the output level voltage is suitable for programming a memory cell.

The latch unit 34 coupled to the level shifter 32 receives a first signal having a logical level representing a bit datum of the data stream DTS0 in the duty period of the bit datum and produces a second signal in opposite phase with the first signal. The inverter switch 35, coupled to the transistor 31 and the latch unit 34, and receiving the second signal provides an operating signal VM, having a voltage level corresponding to the bit datum in the duty period, through the data line DL to the data selection circuit 21. The inverter switch 35 includes a PMOS transistor 351 and an NMOS transistor 352 coupled thereto.

In order to fit the dimension shrinkage of the manufacturing process and decrease the needed time programming or reading the memory cell (such as reducing the duty-gap period PB1), it is necessary to provide a more efficient circuit and method for transmitting a data stream.

SUMMARY OF THE INVENTION

It is an object of the present invention to provide a circuit and a method for transmitting a data stream. Therefore, the needed time programming or reading a memory device is shortened.

It is therefore an aspect of the present invention to provide the circuit including a first data selection circuit and a second data selection circuit for transmitting the data stream. The first data selection circuit having first controllable channels turns on a first operating channel being one of the first controllable channels in an odd-numbered period and turns off the first controllable channels in an even-numbered period adjacent to the odd-numbered period for transmitting a first bit datum of the data stream. The second data selection circuit having second controllable channels turns off the second controllable channels in the odd-numbered period and turns on a second operating channel being one of the second controllable channels in the even-numbered period for transmitting a second bit datum of the data stream.

It is therefore another aspect of the present invention to provide the method for transmitting the data stream in a circuit having first controllable channels and second controllable channels. The method includes the following steps. A first bit datum of the data stream is transmitted in a first operating channel being one of the first controllable channels in an odd-numbered period through turning on the first operating channel and turning off the second controllable channels; and a second bit datum of the data stream is transmitted in a second operating channel being one of the second controllable channels in an even-numbered period through turning on the second operating channel and turning off the first controllable channels.

The above objects and advantages of the present invention will become more readily apparent to those ordinarily skilled in the art after reviewing the following detailed descriptions and accompanying drawings, in which:

DETAIL DESCRIPTION OF THE PREFERRED EMBODIMENT

The present invention will now be described more specifically with reference to the following embodiments. It is to be noted that the following descriptions of preferred embodiments of this invention are presented herein for the purposes of illustration and description only; it is not intended to be exhaustive or to be limited to the precise form disclosed.

Figure 1:
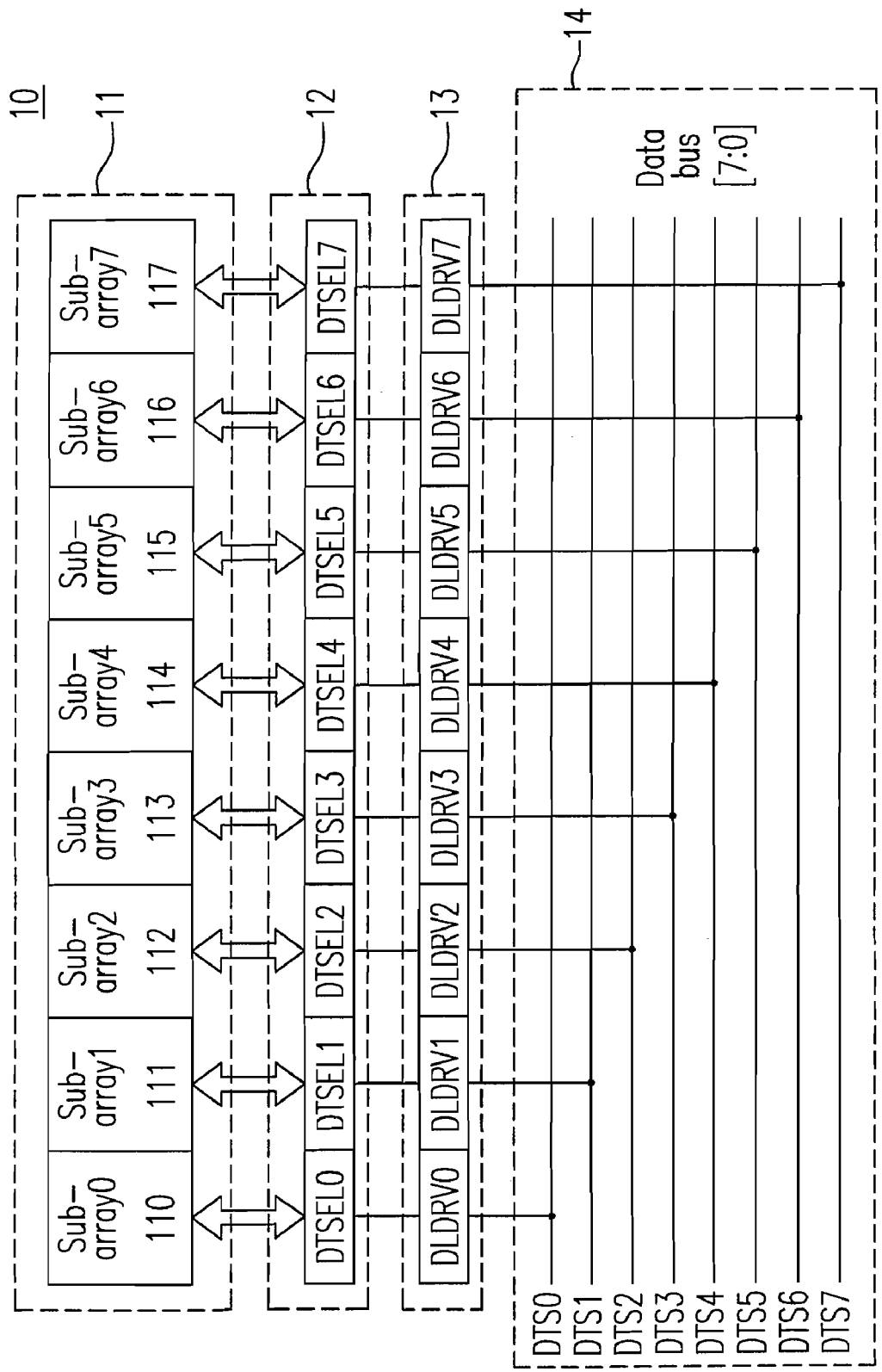
FIG. 1 is a block diagram showing a conventional nonvolatile memory device.
Figure 2:
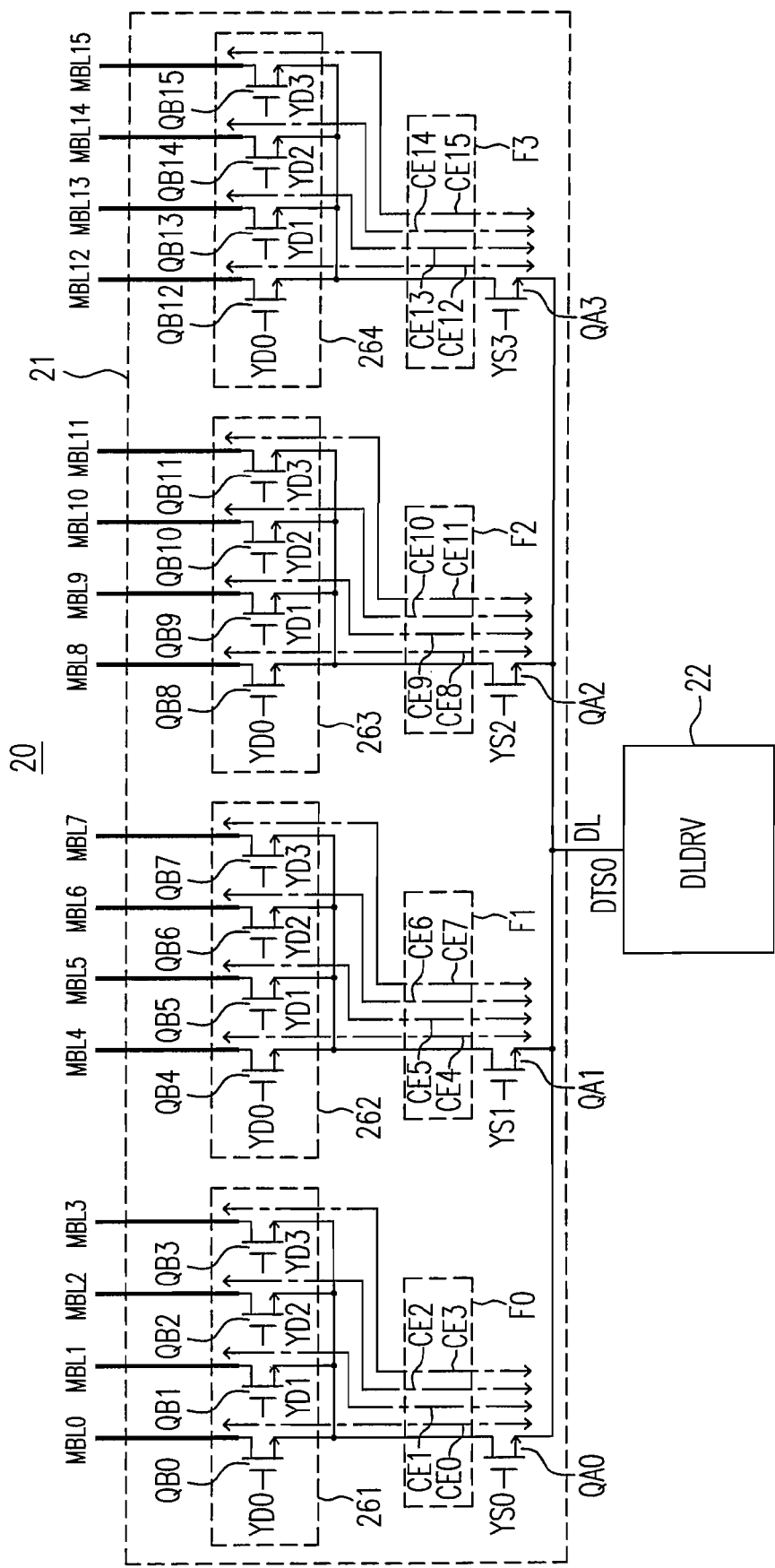
FIG. 2 is a block diagram showing a conventional circuit for transmitting a data stream.
Figure 3:
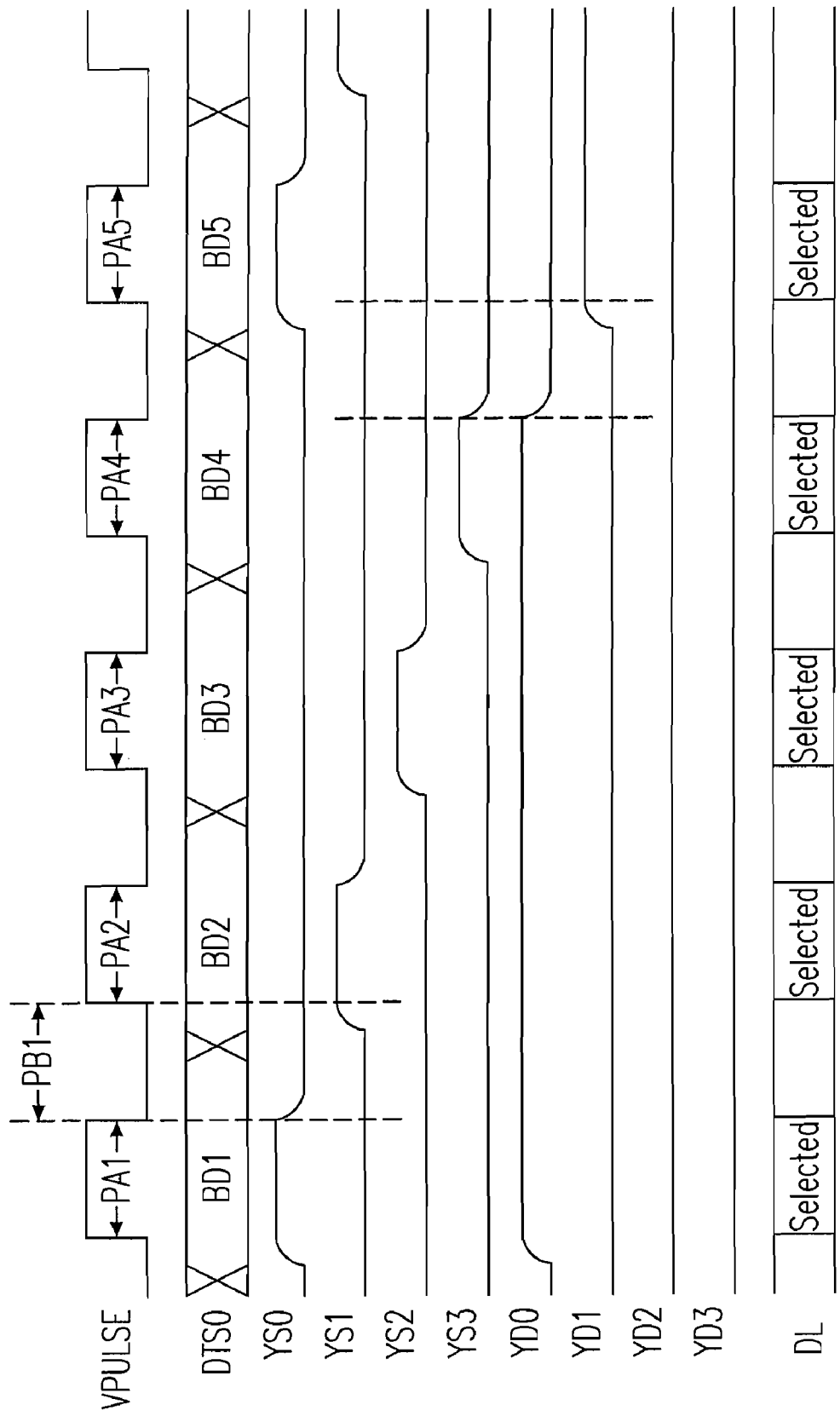
FIG. 3 is a schematic diagram showing conventional waveforms coming from FIG. 2 for transmitting the data stream.
Figure 4:
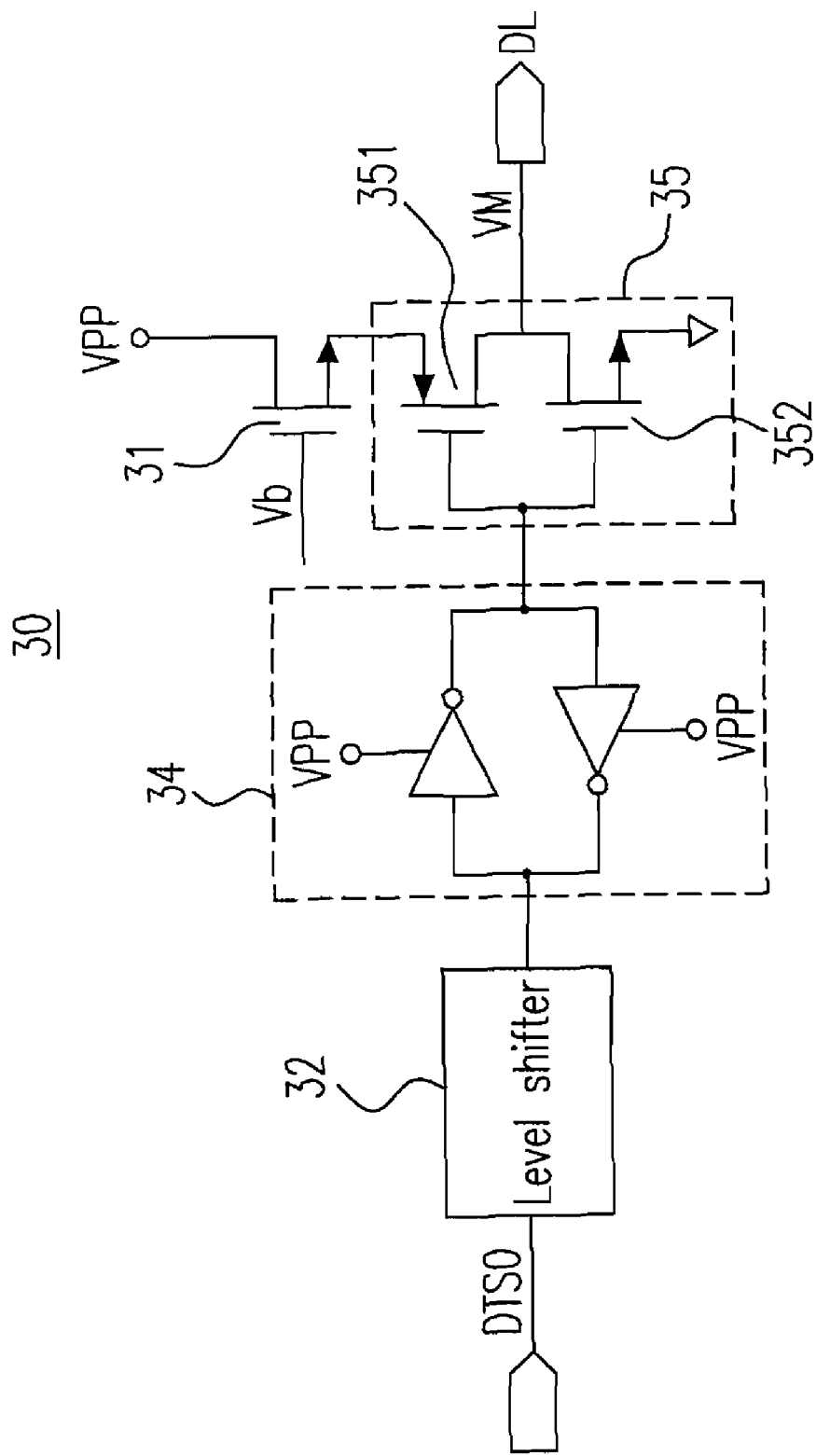
FIG. 4 is a schematic diagram showing a conventional circuit according to the embodiment for the data line driver in FIG. 2.
Figure 5:
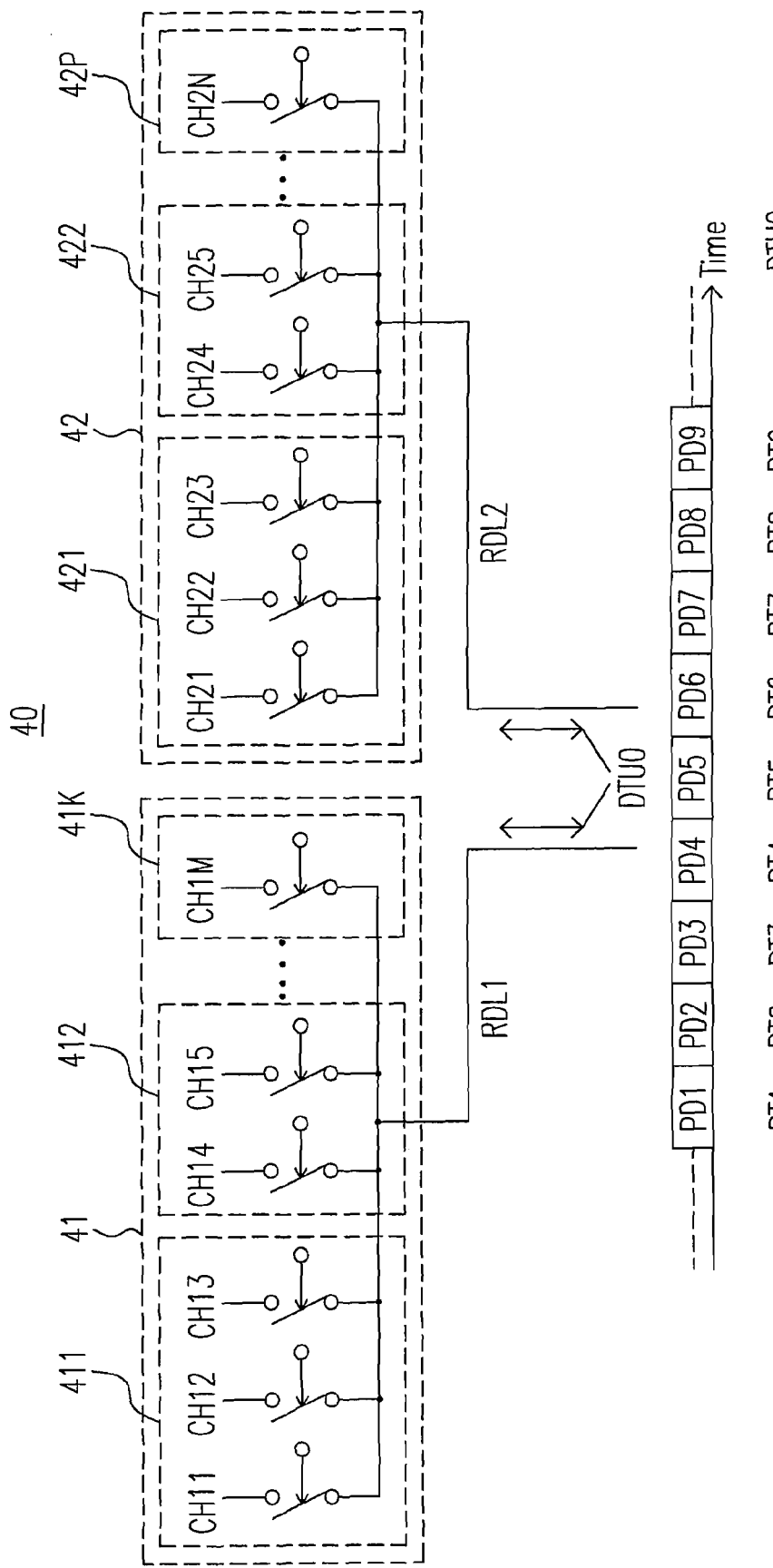
FIG. 5 is a schematic diagram showing a circuit and a timing sequence for transmitting a data stream according to the first embodiment of the present invention.

Please refer to FIG. 5, which is a schematic diagram showing a circuit and a timing sequence for transmitting a data stream according to the first embodiment of the present invention. As shown, the circuit 40 includes a data selection circuit 41 and a data selection circuit 42 for transmitting the data stream DTU0. The data stream DTU0 includes a series of bit data BT1, BT2, . . . BT9, . . . distributed in a series of periods PD1, PD2, . . . PD9, respectively and is transmitted through the circuit 40. The series of the periods PD1, PD2, . . . PD9, . . . is classified as odd periods PD1, PD3, PD5, . . . and even periods PD2, PD4, PD6, . . . wherein the adjacent two periods are adjoining.

The data selection circuit 41 having controllable channels CH11, CH12, . . . and CH1M, turns on a first operating channel (such as CH14) being one of the controllable channels CH11, CH12, . . . and CH1M in an odd-numbered period (such as PD3) and turns off the controllable channels CH11, CH12, . . . and CH1M in an even-numbered period (such as PD4) adjacent to the odd-numbered period (such as PD3) for transmitting a first bit datum (such as BT3) of the data stream DTU0. The first bit datum (such as BT3) is transmitted in a root data line RDL1 and the first operating channel (such as CH14).

The data selection circuit 42 having controllable channels CH21, CH22, . . . and CH2N, turns off the controllable channels CH21, CH22, . . . and CH2N in the odd-numbered period (such as PD3) and turns on a second operating channel (such as CH24) being one of the controllable channels CH21, CH22, ... and CH2N in the even-numbered period (such as PD4) for transmitting a second bit datum (such as BT4) of the data stream DTU0. The second bit datum (such as BT4) is transmitted in a root data line RDL2 and the second operating channel (such as CH24).

The controllable channels CH11, CH12, ... and CH1M are classified as controllable channel sets 411, 412, ... and 41K, and the controllable channels CH21, CH22, ... and CH2N are classified as controllable channel sets 421, 422, ... and 42P. When a number of the controllable channel sets 411, 412, ... and 41K is equal to a number of the controllable channel sets 421, 422, ... and 42P and a number of the controllable channels CH11, CH12, ... and CH1M is equal to a number of the controllable channels CH21, CH22, ... and CH2N, controllable channels selected from the controllable channel sets 411, 412, ... and 41K and the controllable channel sets 421, 422, ... and 42P are turned on in a positional order.

The circuit can be used for programming the data stream DTU0 to a nonvolatile memory or can be used for obtaining the data stream DTU0 read from the nonvolatile memory.

Figure 6:
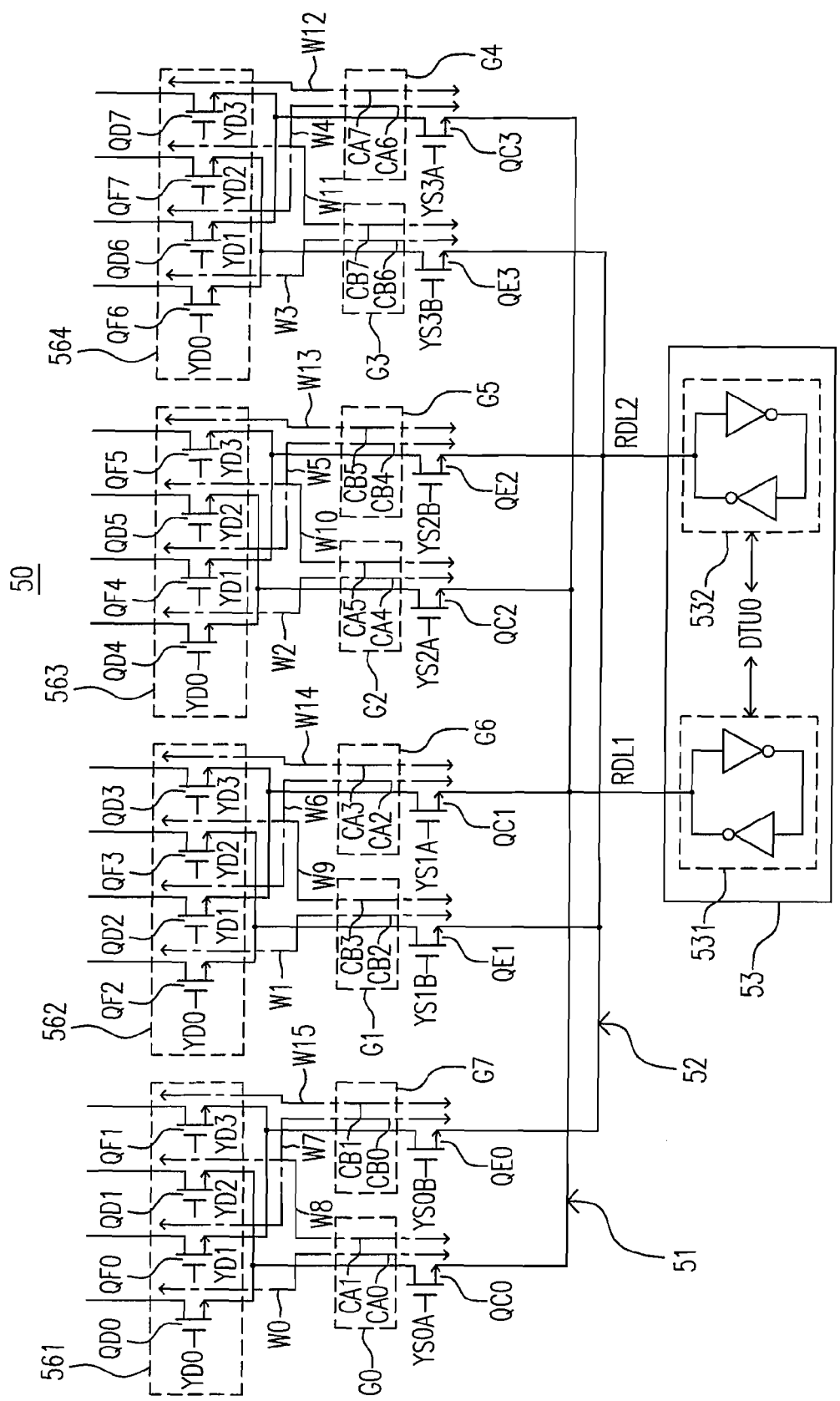
FIG. 6 is a schematic diagram showing a circuit for transmitting a data stream according to the second embodiment of the present invention.

Please refer to FIG. 6, which is a schematic diagram showing a circuit for transmitting a data stream according to the second embodiment of the present invention. As shown, the circuit 50 includes a data selection circuit 51, a data selection circuit 52 and a data line driver 53 for transmitting the data stream DTU0. The data stream DTU0 includes a series of bit data distributed in a series of periods respectively and is transmitted through the circuit 50.

The data selection circuit 51 includes four primary switches QC0, QC1, QC2, and QC3, correspondingly controlled by four control signals YS0A, YS1A, YS2A, and YS3A, and eight secondary switches QD0, QD1, QD2, QD3, QD4, QD5, QD6, and QD7 correspondingly controlled by eight control signals YD0, YD2, YD1, YD3, YD0, YD2, YD1, and YD3. The source terminals of the four primary switches QC0, QC1, QC2, and QC3 are commonly coupled as a root data line RDL1. The eight secondary switches QD0, QD1, ... and QD7 are equally grouped as four secondary switch sets correspondingly coupled to the drain terminals of the four primary switches QC0, QC1, QC2, and QC3 in four tree connecting architectures. Therefore, there are eight controllable channels CA0, CA1, ... and CA7 formed between the root data line RDL1 and the drain terminals of the eight secondary switches QD0, QD1, ... and QD7. For instance, the combination of the primary switch QC0 with the secondary switch QD0 forms the controllable channel CA0, and control signals YS0A and YD0 control the turn-on or turn-off state of the controllable channel CA0. When the primary switch QC0 and the secondary switch QD0 are both turned on, the controllable channel CA0 is turned on. Corresponding to the four primary switches QC0, QC1, QC2, and QC3, the eight controllable channels CA0, CA1, ... and CA7 are grouped as four controllable channel sets G0, G6, G2, and G4.

The data selection circuit 52 includes four primary switches QE0, QE1, QE2, and QE3, correspondingly controlled by four control signals YS0B, YS1B, YS2B, and YS3B, and eight secondary switches QF0, QF1, QF2, QF3, QF4, QF5, QF6, and QF7 correspondingly controlled by eight control signals YD1, YD3, YD0, YD2, YD1, YD3, YD0, and YD2. The source terminals of the four primary switches QE0, QE1, QE2, and QE3 are commonly coupled as a root data line RDL2. The eight secondary switches QF0, QF1, ... and QF7 are equally grouped as four secondary switch sets correspondingly coupled to the drain terminals of the four primary switches QE0, QE1, QE2, and QE3 in four tree connecting architectures. Therefore, there are eight controllable channels CB0, CB1, ... and CB7 formed between the root data line RDL2 and the drain terminals of the eight secondary switches QF0, QF1, ... and QF7. Corresponding to the four primary switches QE0, QE1, QE2, and QE3, the eight controllable channels CB0, CB1, ... and CB7 are grouped as four controllable channel sets G7, G1, G5, and G3.

The four primary switches QC0, QC1, QC2, and QC3 and the four primary switches QE0, QE1, QE2, and QE3 are all transistors, and they are interlaced and are arranged in the positional order of QC0, QE0, QE1, QC1, QC2, QE2, QE3, and QC3. The eight secondary switches QD0, QD1, ... and QD7 and the eight secondary switches QF0, QF1, ... and QF7 are all transistors, and they are interlaced and are grouped as four interlacing switch sets 561, 562, 563, and 564, wherein four switches (such as QD0, QF0, QD1, and QF1) of each interlacing switch sets (such as 561) correspondingly receive control signals YD0, YD1, YD2, and YD3.

Controllable channels in the four controllable channel sets G0, G6, G2, and G4 and the four controllable channel sets G7, G1, G5, and G3 are turned on in the sequential periods respectively according to the positional order of G0, G1, G2, G3, G4, G5, G6, and G7 for transmitting the bit data of the data stream DTU0 in the given order. The eight controllable channels CA0, CA1, ... and CA7 and the eight controllable channels CB0, CB1, ... and CB7 are turned on according to the positional order of W0, W1, W2, W3, W4, W5, W6, W7, W8, W9, W10, W11, W12, W13, W14, and W15.

The data line driver 53 includes a latch unit 531 and a latch unit 532. The latch unit 531 is coupled to the data selection circuit 51 through the root data line RDL1. In an odd period, the latch unit 531 stores a first bit datum of the data stream DTU0 and a controllable channel of the data selection circuit 51 is turned on for transmitting the first bit datum. The second latch unit 532 is coupled to the data selection circuit 52 through the root data line RDL2. In an even period, the second latch unit stores a second bit datum of the data stream DTU0 and a controllable channel of the data selection circuit 52 is turned on for transmitting the second bit datum.

Figure 7:
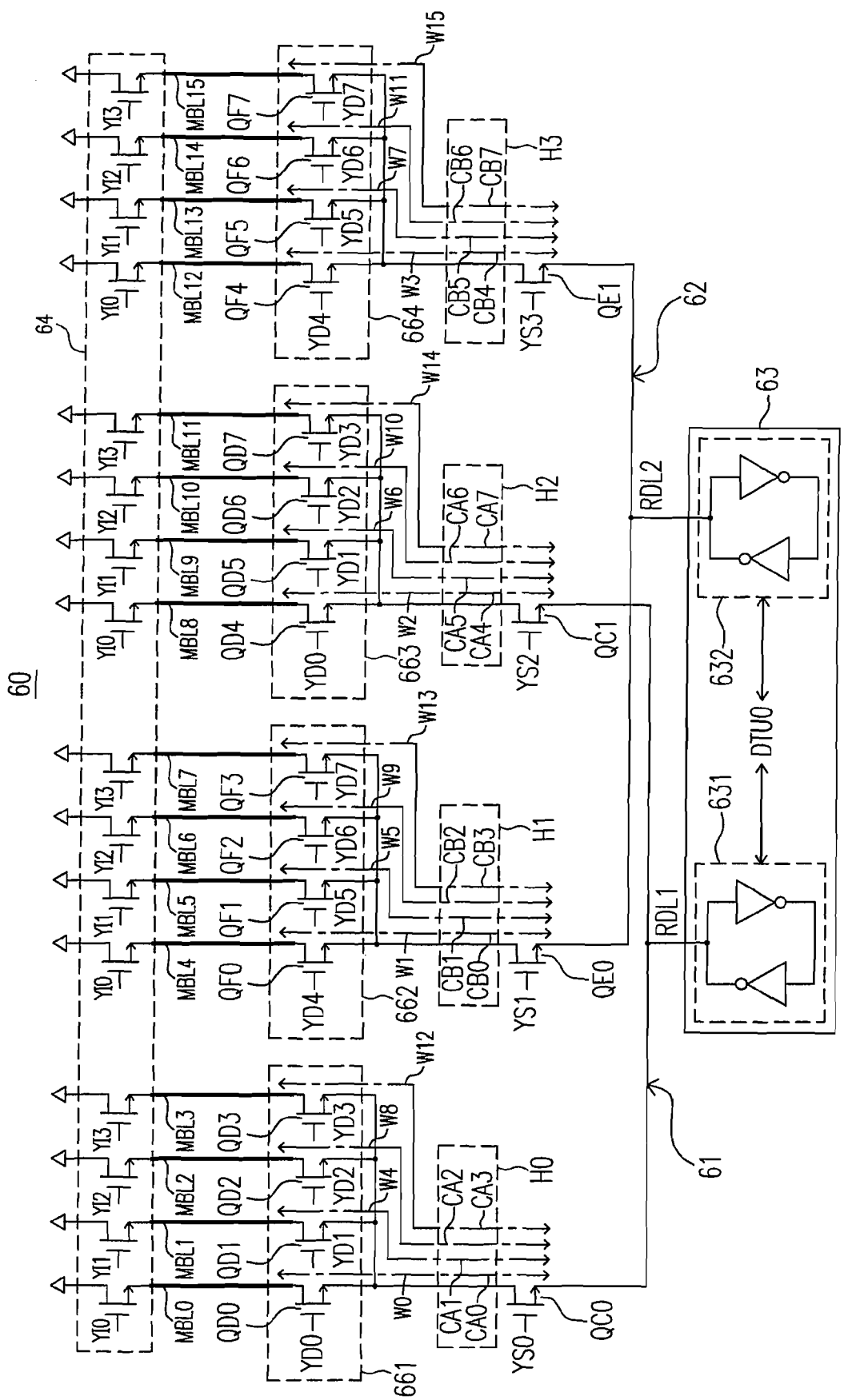
FIG. 7 is a schematic diagram showing a circuit for transmitting a data stream according to the third embodiment of the present invention.

Please refer to FIG. 7, which is a schematic diagram showing a circuit for transmitting a data stream according to the third embodiment of the present invention. As shown, the circuit 60 includes a data selection circuit 61, a data selection circuit 62, a data line driver 63, and a bit line switch set 64 for transmitting the data stream DTU0. The data stream DTU0 includes a series of bit data distributed in a series of periods respectively and is transmitted through the circuit 60.

The data selection circuit 61 includes two primary switches QC0, and QC1 correspondingly controlled by two control signals YS0, and YS2, and eight secondary switches QD0, QD1, QD2, QD3, QD4, QD5, QD6, and QD7 correspondingly controlled by eight control signals YD0, YD1, YD2, YD3, YD0, YD1, YD2, and YD3. The source terminals of the two primary switches QC0, and QC1 are commonly coupled as a root data line RDL1. The eight secondary switches QD0, QD1, ... and QD7 are equally grouped as two secondary switch sets 661, and 663 correspondingly coupled to the drain terminals of the two primary switches QC0, and QC1 in two tree connecting architectures. Therefore, there are eight controllable channels CA0, CA1, ... and CA7 formed between the root data line RDL1 and the drain terminals of the eight secondary switches QD0, QD1, ... and QD7. Corresponding to the two primary switches QC0, and QC1, the eight controllable channels CA0, CA1, ... and CA7 are grouped as two controllable channel sets H0, and H2.

The data selection circuit 62 includes two primary switches QE0, and QE1 correspondingly controlled by two control signals YS1, and YS3, and eight secondary switches QF0, QF1, QF2, QF3, QF4, QF5, QF6, and QF7 correspondingly controlled by eight control signals YD4, YD5, YD6, YD7, YD4, YD5, YD6, and YD7. The source terminals of the two primary switches QE0, and QE1 are commonly coupled as a root data line RDL2. The eight secondary switches QF0, QF1, . . . and QF7 are equally grouped as two secondary switch sets 662, and 664 correspondingly coupled to the drain terminals of the two primary switches QE0, and QE1 in two tree connecting architectures. Therefore, there are eight controllable channels CB0, CB1, . . . and CB7 formed between the root data line RDL2 and the drain terminals of the eight secondary switches QF0, QF1, . . . and QF7. Corresponding to the two primary switches QE0, and QE1, the eight controllable channels CB0, CB1, . . . and CB7 are grouped as two controllable channel sets H1 and H3.

The two primary switches QC0, and QC1 and the two primary switches QE0, and QE1 are all transistors, and they are interlaced and are arranged in the positional order of QC0, QE0, QC1, and QE1. The two secondary switch sets 661, and 663 and the two secondary switch sets 662, and 664 are interlaced. Four switches (such as QD0, QD1, QD2, and QD3) of each secondary switch sets (such as 661) of the data selection circuit 61 correspondingly receive control signals YD0, YD1, YD2, and YD3, and four switches (such as QF0, QF1, QF2, and QF3) of each secondary switch sets (such as 662) of the data selection circuit 62 correspondingly receive control signals YD4, YD5, YD6, and YD7.

Controllable channels in the two controllable channel sets H0, and H2 and the two controllable channel sets H1, and H3 are turned on in the sequential periods respectively according to the positional order of H0, H1, H2, and H3 for transmitting the bit data of the data stream DTU0 in the given order. The eight controllable channels CA0, CA1, . . . and CA7 and the eight controllable channels CB0, CB1, . . . and CB7 are turned on according to the positional order of W0, W1, W2, W3, W4, W5, W6, W7, W8, W9, W10, W11, W12, W13, W14, and W15.

The data line driver 63 includes a latch unit 631 and a latch unit 632 and its function corresponds to the data line driver 53 in FIG. 6.

In FIG. 7, the bit line switch set 64 includes sixteen bit line switches the source terminals of which correspondingly coupled to the drain terminals of the eight secondary switches QD0, QD1, . . . and QD7 and the eight secondary switches QF0, QF1, . . . and QF7 through sixteen metal bit lines MBL0, MBL1, . . . and MBL15.

Figure 8:
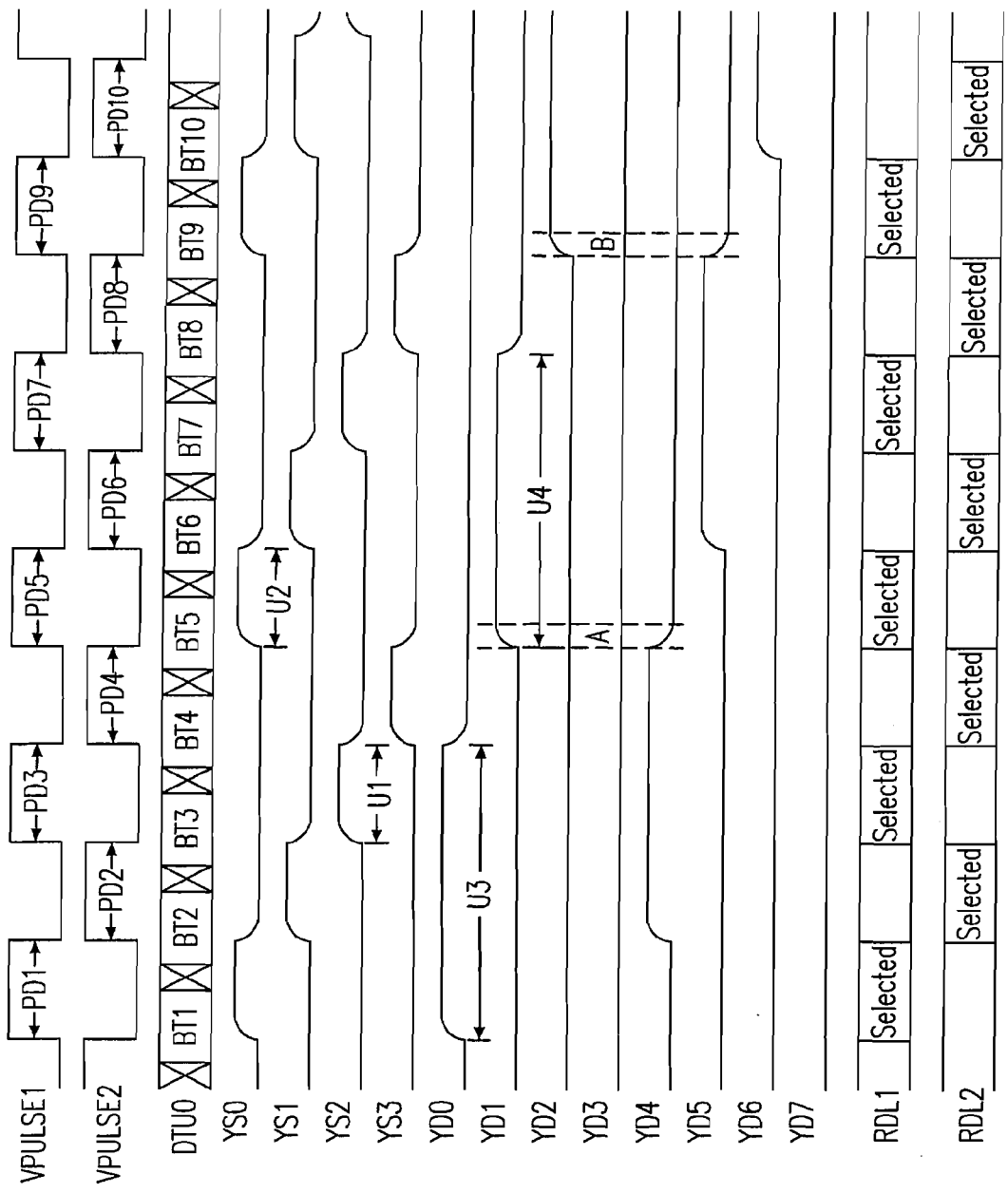
FIG. 8 is a schematic diagram showing waveforms coming from FIG. 7 for transmitting the data stream according to the present invention.

Afterward, the timing sequence of the circuit 60 in FIG. 7 is illustrated for an example programming a nonvolatile memory (not shown). Please refer to FIG. 8, which is a schematic diagram showing waveforms coming from FIG. 7 for transmitting the data stream according to the present invention. The waveforms in FIG. 8 are a pulse signal VPULSE1, a pulse signal VPULSE2, the data stream DTU0, four control signals YS0, YS1, YS2, and YS3, eight control signals YD0, YD1, YD2, YD3, YD4, YD5, YD6, and YD7, the timing of the data stream DTU0 in the root data line RDL1, and the timing of the data stream DTU0 in the root data line RDL2.

Bit data BT1, BT2, BT3, . . . of the data stream DTU0 is provided to the data line driver 63 in the given order, wherein the bit datum BT1 is adjacent to the bit datum BT2 in the timing. The high-level pulse periods of the pulse signal VPULSE1 represent the odd periods PD1, PD3, PD5, . . . the data selection circuit 61 is turned on, and the high-level pulse periods of the pulse signal VPULSE2 represent the even periods PD2, PD4, PD6, . . . the data selection circuit 62 is turned on, wherein the pulse signal VPULSE2 is an inverting signal of the pulse signal VPULSE1.

A first bit datum (such as BT3) of the data stream DTU0 is held in the root data line RDL1 with a first voltage level corresponding to the first bit datum (such as BT3) in an odd-numbered period (such as PD3), and a second bit datum (such as BT4) of the data stream DTU0 is held in the root data line RDL2 with a second voltage level corresponding to the second bit datum (such as BT4) in an even-numbered period (such as PD4).

When the even-numbered period PD4 ends; that is, the odd-numbered period PD5 begins, the voltages of the control signals YS3 and YD4 fall and the voltages of the control signals YS0 and YD1 rise; that is, the previous turn-on controllable channel CB4 is turned off and the controllable channel CA1 is turned on, for transmitting the bit datum BT5 in the odd-numbered period PD5. When the odd-numbered period PD5 ends; that is, the even-numbered period PD6 begins, the voltages of the control signals YS1 and YD5 fall and the voltage of the control signal YS0 rises; that is, the previous turn-on controllable channel CA1 is turned off and the controllable channel CB1 is turned on, for transmitting the bit datum BT6 in the even-numbered period PD6.

For the data selection circuit 61, there is at least a period (such as PD4) between two adjacent turn-on periods (such as U1 and U2) formed by the two primary switches QC0 and QC1, and there is at least a period (such as PD4) between two adjacent turn-on periods (such as U3 and U4) formed by the eight secondary switches QD0, QD1, . . . and QD7. The voltage rising time and the voltage falling time near the boundary between two adjacent periods have an overlap (such as A). There is also the similar phenomenon for the data selection circuit 62. Therefore, the disturbance phenomenon will not occur between two adjacent turn-on controllable channels (such as CA1 and CB1).

Figure 9:
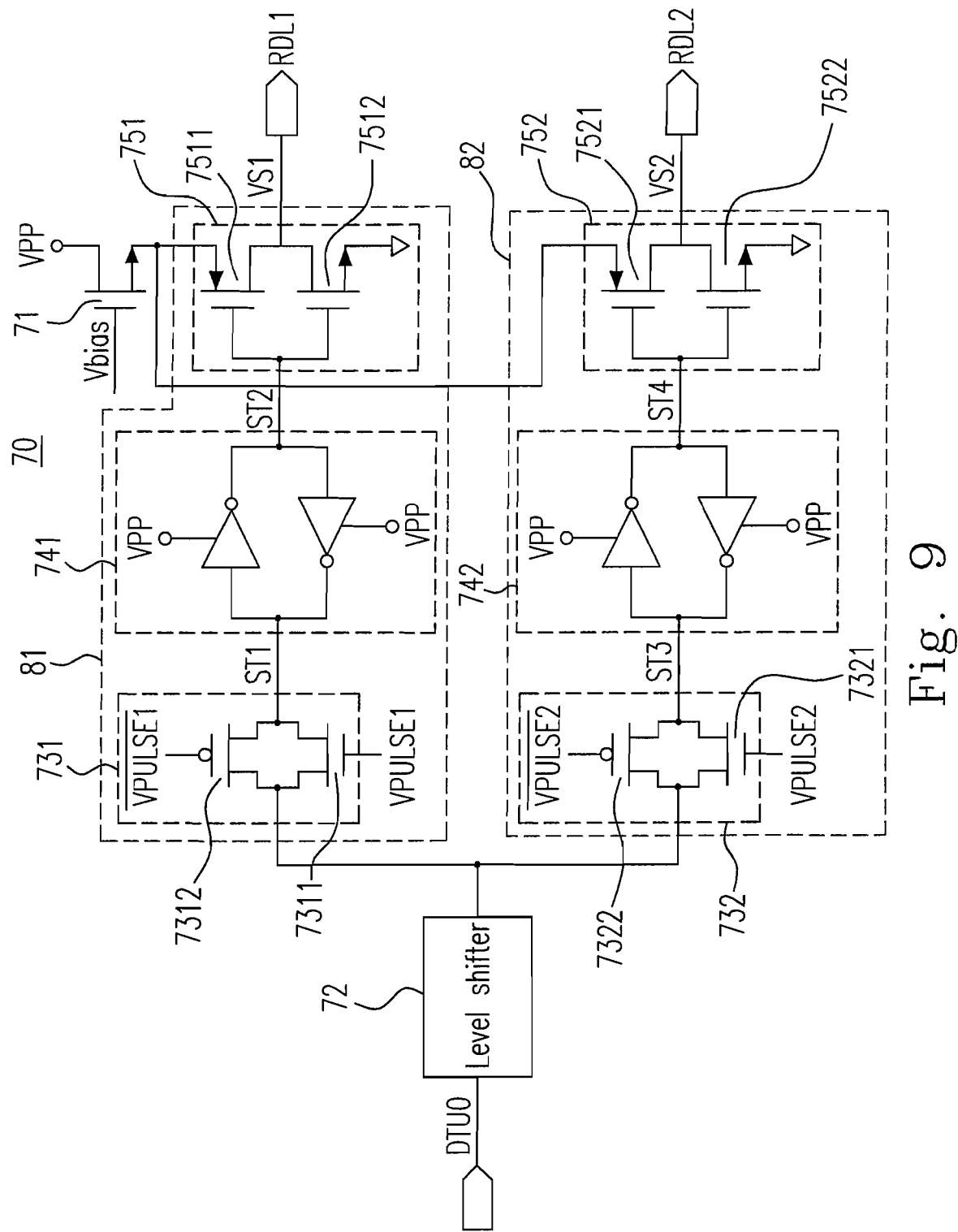
FIG. 9 is a schematic diagram showing a circuit for the data line driver in FIG. 7 according to the fourth embodiment of the present invention.

Please refer to FIG. 9, which is a schematic diagram showing a circuit for the data line driver in FIG. 7 according to the fourth embodiment of the present invention. As shown, a data line driver 70 for programming includes a transistor 71, a level shifter 72, a switch 731, a switch 732, a latch unit 741, a latch unit 742, an inverter switch 751, and an inverter switch 752. The gate of the transistor 71 receives a bias voltage Vbias and forms the configuration of a source follower. The level shifter 32 receives the data stream DTU0 and converts a level voltage of the data stream DTU0, so that the output level voltage is suitable for programming a memory cell.

The switch 731 coupled to the level shifter 72 receives a pulse signal VPULSE1 making the switch 731 be turned on in the odd-numbered period for producing a signal ST1 having a first logical level representing a first bit datum of the data stream DTU0 in the odd-numbered period. The switch 732 coupled to the level shifter 72 receives a pulse signal VPULSE2 making the switch 732 be turned on in the even-numbered period for producing a signal ST3 having a second logical level representing a second bit datum of the data stream DTU0 in the even-numbered period, wherein the pulse signal VPULSE2 is suitable as an inverting signal of the pulse signal VPULSE1. The switch 731 and the switch 732 are both CMOS switches each of which includes an NMOS transistor (such as 7311) and a PMOS transistor (such as 7312) coupled thereto.

The latch unit 741 coupled to the switch 731, receives the signal ST1 for producing a signal ST2 in opposite phase with the signal ST1. The latch unit 742 coupled to the switch 732, receives the signal ST3 for producing a signal ST4 in opposite phase with the signal ST3.

The inverter switch 751 coupled to the transistor 71 and the latch unit 741, and receiving the signal ST2 provides an operating signal VS1, having a first voltage level corresponding to the first bit datum in the odd-numbered period, to the data selection circuit 61 through the root data line RDL1. The inverter switch 752 coupled to the transistor 71 and the latch unit 742, and receiving the signal ST4 provides an operating signal VS2, having a second voltage level corresponding to the second bit datum in the even-numbered period, to the data selection circuit 62 through the root data line RDL2.

The data line driver 70 can be considered as a circuit for transmitting a data stream DTU0 and includes a data line sub-driver 81 and a data line sub-driver 82. The data line sub-driver 81 setting up the first voltage level, corresponding to the first bit datum of the data stream DTU0, of the operating signal VS1 in the odd-numbered period for transmitting the first bit datum, wherein the data line sub-driver 81 includes the switch 731, the latch unit 741, and the inverter switch 751. The data line sub-driver 82 setting up the second voltage level, corresponding to the second bit datum of the data stream DTU0, of the operating signal VS2 in the even-numbered period for transmitting the second bit datum, wherein the data line sub-driver 82 includes the switch 732, the latch unit 742, and the inverter switch 752.

Afterward, the method for transmitting a data stream DTU0 in the circuit 40 having controllable channels CH11, CH12, . . . and CH1M and controllable channels CH21, CH22, . . . and CH2N according to the FIG. 5 of the present invention is described. The method includes the following steps. A first bit datum (such as BT3) of the data stream DTU0 is transmitted in a first operating channel (such as CH14) being one of the controllable channels CH11, CH12, . . . and CH1M in an odd-numbered period (such as PD3) through turning on the first operating channel (such as CH14) and turning off the controllable channels CH21, CH22, . . . and CH2N; and a second bit datum (such as BT4) of the data stream DTU0 is transmitted in a second operating channel (such as CH24) being one of the controllable channels CH21, CH22, . . . and CH2N in an even-numbered period (such as PD4) adjacent to the odd-numbered period (such as PD3) through turning on the second operating channel (such as CH24) and turning off the controllable channels CH11, CH12, . . . and CH1M.

Please refer to FIG. 7, FIG. 8, and FIG. 9 again. When the data stream DTU0 is programmed to a nonvolatile memory (not shown), the first bit datum (such as BT3) is stored in the odd-numbered period (such as PD3). Next, the first operating signal VS1 representing the first bit datum (such as BT3) is produced. Next, the first operating signal VS1 is transmitted in the first operating channel (such as CA4). The second bit datum (such as BT4) is stored in the even-numbered period (such as PD4). Next, the second operating signal VS2 representing the second bit datum (such as BT4) is produced. Next, the second operating signal VS2 is transmitted in the second operating channel (such as CB4).

When the data stream DTU0 is obtained from reading the nonvolatile memory, the first operating signal VS1 representing the first bit datum (such as BT3) is produced in the odd-numbered period (such as PD3). Next, the first operating signal VS1 transmitted in the first operating channel (such as CA4). Next, the first bit datum (such as BT3) is stored. The second operating signal VS2 representing the second bit datum (such as BT4) is produced in the even-numbered period (such as PD4), wherein the second bit datum (such as BT4) is adjacent to the first bit datum (such as BT3). Next, the second operating signal VS2 is transmitted in the second operating channel (such as CB4). Next, the second bit datum (such as BT4) is stored.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A circuit for transmitting a data stream having a first bit datum and a second bit datum, comprising:
   a first data selection circuit having first controllable channels, turning on a first operating channel being one of the first controllable channels in an odd-numbered period and turning off the first controllable channels in an even-numbered period adjacent to the odd-numbered period for transmitting the first bit datum of the data stream; and
   a second data selection circuit having second controllable channels, turning off the second controllable channels in the odd-numbered period and turning on a second operating channel being one of the second controllable channels in the even-numbered period for transmitting the second bit datum of the data stream, wherein the first bit datum is adjacent to the second bit datum.

2. The circuit of claim 1, wherein the first controllable channels are correspondingly coupled to first metal bit lines and the second controllable channels are correspondingly coupled to second metal bit lines.

3. The circuit of claim 1, wherein the first data selection circuit further comprises:
   first switches having first connecting terminals and second connecting terminals serving as a first root data line for transmitting the first bit datum; and
   second switches correspondingly coupled to the first connecting terminals according to a first grouping and tree connecting architecture, wherein the second switches and the first switches are controllable for forming the first controllable channels grouped as first controllable channel sets; and
   the second data selection circuit further comprises:
   third switches having third connecting terminals and fourth connecting terminals serving as a second root data line for transmitting the second bit datum; and
   fourth switches correspondingly coupled to the third connecting terminals according to a second grouping and tree connecting architecture, wherein the fourth switches and the third switches are controllable for forming the second controllable channels grouped as second controllable channel sets.

4. The circuit of claim 3, wherein when a selected second switch, being one of the second switches, and a corresponding first switch, being one of the first switches, are both turned on, a selected first controllable channel, being one of the first controllable channels, is turned on.

5. The circuit of claim 3, wherein when a number of the first switches is equal to a number of the third switches and a number of the second switches is equal to a number of the fourth switches, the first controllable channel sets and the second controllable channel sets are interlaced, so that the first controllable channels and the second controllable channels are turned on in a positional order.

6. The circuit of claim 3, wherein there is at least a period between two adjacent first turn-on periods formed by the first switches, and there is at least a period between two adjacent second turn-on periods formed by the second switches, and each of the first switches is a transistor.

7. The circuit of claim 1, further comprising a data line driver coupled to the first data selection circuit and the second data selection circuit for transmitting the first bit datum in the first operating channel in the odd-numbered period and transmitting the second bit datum in the second operating channel in the even-numbered period.

8. The circuit of claim 7, whereof the data line driver further comprises:
a first transistor having a gate receiving a bias voltage, and forming a configuration of a source follower;
a level shifter receiving the data stream and converting a level voltage of the data stream;
a first switch coupled to the level shifter and receiving a first pulse signal making the first switch be turned on in the odd-numbered period;
a first latch unit coupled to the first switch;
a first inverter switch coupled to the first transistor and the first latch unit;
a second switch coupled to the level shifter and receiving a second pulse signal making the second switch be turned on in the even-numbered period;
a second latch unit coupled to the second switch; and
a second inverter switch coupled to the first transistor and the second latch unit.

9. The circuit of claim 8, wherein:
the second bit datum is adjacent to the first bit datum;
the second pulse signal is an inverting signal of the first pulse signal;
each of the first switch and the second switch is a CMOS switch; and
each of the first inverter switch and the second inverter switch includes a PMOS transistor and an NMOS transistor coupled thereto.

10. The circuit of claim 1, being used for programming the data stream to a nonvolatile memory.

11. The circuit of claim 1, being used for obtaining the data stream read from a nonvolatile memory.

12. A method for transmitting a data stream having a first bit datum and a second bit datum in a circuit having first controllable channels and second controllable channels, comprising steps of:
transmitting the first bit datum of the data stream in a first operating channel being one of the first controllable channels in an odd-numbered period through turning on the first operating channel and turning off the second controllable channels; and
transmitting the second bit datum of the data stream in a second operating channel being one of the second controllable channels in an even-numbered period adjacent to the odd-numbered period through turning on the second operating channel and turning off the first controllable channels, wherein the first bit datum is adjacent to the second bit datum.

13. The method of claim 12, further comprising steps of:
classifying the first controllable channels as first controllable channel sets;
classifying the second controllable channels as second controllable channel sets; and
interlacing the first controllable channel sets and the second controllable channel sets when a number of the first controllable channel sets is equal to a number of the second controllable channel sets and a number of the first controllable channels is equal to a number of the second controllable channels for allowing the first controllable channels and the second controllable channels being turned on in a positional order.

14. The method of claim 12, further comprising steps of:
storing the first bit datum in the odd-numbered period;
producing a first operating signal representing the first bit datum;
transmitting the first operating signal in the first operating channel;
storing the second bit datum in the even-numbered period;
producing a second operating signal representing the second bit datum; and
transmitting the second operating signal in the second operating channel.

15. The method of claim 12, further comprising steps of:
producing a first operating signal representing the first bit datum in the odd-numbered period;
transmitting the first operating signal in the first operating channel;
storing the first bit datum;
producing a second operating signal representing the second bit datum in the even-numbered period, wherein the second bit datum is adjacent to the first bit datum;
transmitting the second operating signal in the second operating channel; and
storing the second bit datum.

16. The method of claim 12, further comprising steps of:
corresponding the odd-numbered period to a first high level period of a first pulse signal; and
corresponding the even-numbered period to a second high level period of a second pulse signal, wherein the second pulse signal is an inverting signal of the first pulse signal.

17. The method of claim 12, wherein the first controllable channels are correspondingly coupled to first metal bit lines and the second controllable channels are correspondingly coupled to second metal bit lines.

18. The method of claim 12, being used for programming the data stream to a nonvolatile memory.

19. The method of claim 12, being used for obtaining the data stream read from a nonvolatile memory.

20. A circuit for transmitting a data stream having a first bit datum and a second bit datum, comprising:
a first data line sub-driver, in response to a first pulse signal, setting up a first voltage level corresponding to the first bit datum of the data stream in an odd-numbered period for transmitting the first bit datum, and turning off transmitting the second bit datum through the first data line sub-driver in an even-numbered period adjacent to the odd-numbered period; and
a second data line sub-driver, in response to a second pulse signal, setting up a second voltage level corresponding to the second bit datum of the data stream in the even-numbered period for transmitting the second bit datum, and turning off transmitting the first bit datum through the second data line sub-driver in the odd-numbered period, wherein the second pulse signal is an inverting signal of the first pulse signal.

21. The circuit of claim 20, wherein the first data line sub-driver further comprises:
a first switch receiving the data stream and receiving the first pulse signal making the first switch be turned on in the odd-numbered period for producing a first signal;
a first latch unit receiving the first signal for producing a second signal in opposite phase with the first signal; and
a first inverter switch receiving the second signal and producing a first operating signal having the first voltage level in the odd-numbered period; and the second data line sub-driver further comprises:
a second switch receiving the data stream and receiving the second pulse signal making the second switch be turned on in the even-numbered period for producing a third signal;
a second latch unit receiving the third signal for producing a fourth signal in opposite phase with the third signal; and
a second inverter switch receiving the fourth signal and producing a second operating signal having the second voltage level in the even-numbered period.

22. The circuit of claim 21, wherein:
the even-numbered period is adjacent to the odd-numbered period;
the second bit datum is adjacent to the first bit datum;
each of the first switch and the second switch is a CMOS switch; and
each of the first inverter switch and the second inverter switch includes a PMOS transistor and an NMOS transistor coupled thereto.

23. The circuit of claim 21, further comprising:
a level shifter coupled to the first switch and the second switch for converting a level voltage of the data stream; and
a transistor coupled to the first inverter switch and the second inverter switch, having a gate receiving a bias voltage, and forming a configuration of a source follower.

24. The circuit of claim 20, being used for programming the data stream to a nonvolatile memory.

* * * * *